(12) United States Patent
Brokish

(10) Patent No.: US 6,665,696 B2
(45) Date of Patent: Dec. 16, 2003

(54) DELAYED ADAPTIVE LEAST-MEAN-SQUARE DIGITAL FILTER

(75) Inventor: Charles W. Brokish, Kingston, IL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/187,187

(22) Filed: Jul. 1, 2002

(65) Prior Publication Data

US 2003/0028569 A1 Feb. 6, 2003

Related U.S. Application Data

(62) Division of application No. 09/713,417, filed on Nov. 15, 2000.
(60) Provisional application No. 60/176,186, filed on Jan. 14, 2000.

(51) Int. Cl.[7] .............................................. G06F 17/10
(52) U.S. Cl. ...................................................... 708/322
(58) Field of Search ................................. 708/322, 319, 708/490, 524

(56) References Cited

U.S. PATENT DOCUMENTS

| | | | | |
|---|---|---|---|---|
| 5,179,531 A | * | 1/1993 | Yamaki | 708/490 |
| 5,535,150 A | * | 7/1996 | Chiang | 708/322 |
| 5,553,014 A | * | 9/1996 | De Leon, II et al. | 708/322 |
| 5,777,914 A | * | 7/1998 | Larsson et al. | 708/322 |
| 5,781,463 A | * | 7/1998 | Ogawa et al. | 708/322 |
| 5,784,304 A | * | 7/1998 | Koike | 708/322 |
| 6,009,448 A | * | 12/1999 | Jong et al. | 708/322 |

* cited by examiner

Primary Examiner—Tan V. Mai
(74) Attorney, Agent, or Firm—Robert D. Marshall, Jr.; W. James Brady, III; Frederick J. Telecky, Jr.

(57) ABSTRACT

A delayed adaptive least-mean-square (LMS) filter, which has one filter coefficient per tap and acquires a new data sample each frame, calculates a finite impulse response (FIR) filter output and updates the filter coefficients using an error term based on the FIR filter output calculated during the preceding frame. The calculations for each tap are performed in a single clock cycle. The filter can be implemented using a general purpose, programmable digital signal processor (DSP) architecture having two multiply and accumulate circuits (MACs), with or without an arithmetic logic unit (ALU), and preferably implements its memory buffers as dual-access or dual-port RAM or banked memory.

8 Claims, 4 Drawing Sheets

DELAYED ADAPTIVE LEAST-MEAN-SQUARE DIGITAL FILTER

This application is a divisional of U.S. patent application Ser. No. 09/713,417 filed Nov. 15, 2000, which claims priority from U.S. Provisional Application No. 60/176,186 filed Jan. 14, 2000.

TECHNICAL FIELD OF THE INVENTION

This invention relates generally to the field of digital signal processors. More specifically, this invention relates to a circuit architecture and method for implementing a delayed adaptive least-mean-square digital filter in a general purpose, programmable digital signal processor.

BACKGROUND OF THE INVENTION

Adaptive digital filters may be used to perform many different tasks, including system identification, equalization, echo cancellation, active noise control, adaptive beamforming, and adaptive reception (i.e. in smart antennas). One method of adjusting the coefficients of an adaptive digital filter is by way of a least-mean-square ("LMS") procedure, in which the filter coefficients are updated based on the error between the LMS filter output and a desired filter output.

More specifically, the error desired to be minimized is the difference between the filter's calculated output, which is calculated by convolving the most recent known input signal sequence with the filter transfer function, and the filter's desired output. The desired output may be based on the measured output of the system. A digital filter whose transfer function is based on a finite number of data samples is called a finite impulse response ("FIR") filter.

For a filter with n coefficients, each coefficient corresponding to a tap, the system retains the most recent n samples of a data sequence and multiplies it by the n coefficients of the filter to get the calculated output. The data sequence $x_m$ includes the last n data samples $x_0, x_1, x_2, \ldots, x_{k-1}, x_k, x_{k+1} \ldots, x_{n-1}$, the most recent retained data sample being $x_0$, and the FIR filter includes coefficients $h_0, h_1, h_2, \ldots, h_{k-1}, h_k, h_{k+1} \ldots, h_{n-1}$. Every time a data sample is taken (in a telephone system that samples a data signal at 8 kHz, this occurs every 125 µs), the LMS procedure requires two main steps that involve each data sample and coefficient: (1) calculating the filter output and (2) updating the coefficients. (Hereinafter, the time period between data sample acquisitions will be referred to as a "frame.") The filter output is calculated by multiplying the data sequence samples by the FIR coefficients, i.e.

$$y = \sum_{k=0}^{n-1} x_k h_k.$$

This requires n multiplications and n additions ($x_0 * h_0 + x_1 * h_1 + x_2 * h_2$, etc.). The updating of coefficients requires two substeps. First, an update term is calculated by multiplying each data sample $x_k$ by a fraction $\beta$ of the error (i.e. $x_k * \beta e$). Next, the corresponding coefficient is updated by adding the update term to the old coefficient (e.g. $h_k(\text{new}) = h_k(\text{old}) + x_k * \beta e$). This coefficient updating also requires n multiplications and n additions. Because the calculation to determine the $\beta e$ term can be performed independently of the updating routine, this multiplication does not need to be performed for each individual coefficient.

In an attempt to simplify memory accesses and minimize power, some conventional implementations perform a "delayed" version of the LMS procedure, in which the data sample acquired during the previous frame and the error based on the data samples retained during the previous frame are used to update the coefficients (e.g. $h_k(\text{new}) = h_k(\text{old}) + x_{k+1} * \beta e_{prev}$). Conventional digital signal processor ("DSP") filter architectures that perform this LMS procedure include an arithmetic logic unit ("ALU") and a multiply and accumulate unit ("MAC"). The ALU is capable of performing addition, subtraction, or boolean algebra on two numbers and placing the result in an accumulator. The MAC is capable of multiplying two numbers, adding this result to another number, and placing the result in an accumulator. To calculate the filter output as well as to update the coefficients, two multiplications and two additions are required to be performed for each tap. Because there is only one multiplier available, two cycles of the clock must be used for each tap. For example, in an n-tap filter, $x_k$ is kept in the data memory buffer and $h_k$ is kept in the coefficient memory buffer. The error term, $\beta e_{prev}$, is calculated based on the previous frame's data samples and is stored in a temporary register because its value is constant for all n taps. The first cycle of the LMS procedure takes $x_{k+1}$ from the data memory buffer and uses the multiplier of the MAC to calculate the update term, $x_{k+1} * \beta e_{prev}$. That update term is stored in a first accumulator. The other cycle of the LMS procedure uses the multiplier of the MAC to calculate the part of the FIR output due to data sample $x_k$, $x_k * h_k$, and that result is stored in a second accumulator. This cycle also uses the ALU to add the contents of the first accumulator (which holds the update term) to the coefficient $h_k$, and the result is put back into the first accumulator. Then, at the beginning of the first cycle of the LMS procedure for the next tap, the contents of the first accumulator are stored in the coefficient memory buffer, writing over the old $h_k$ and leaving the first accumulator to store the update term corresponding to $x_k$ and $h_{k-1}$.

Thus, the LMS procedure requires two clock cycles for each coefficient—one for the coefficient update term multiplication and one for the FIR output multiplication and coefficient update addition. Because this LMS procedure is constantly being performed, any savings in the numbers of clock cycles that it takes could result in significant time and power savings.

SUMMARY OF THE INVENTION

Although application-specific LMS filters may implement filters that reduce the number of clock cycles from two cycles per coefficient, a need has arisen for an improved adaptive LMS digital filter which performs the LMS procedure in a programmable digital signal processor in one clock cycle. In accordance with the present invention, a method for implementing a delayed adaptive LMS filter in a programmable DSP, in which the filter has one filter coefficient per tap and acquires a new data sample each frame, includes calculating an FIR filter output and updating the filter coefficients using an error term based on the FIR filter output calculated during the preceding frame. The calculations for each tap are performed in a single clock cycle.

Preferably, the FIR filter output is calculated by multiplying, in each clock cycle, a data sample and a corresponding coefficient and accumulating the products. Each filter coefficient is preferably updated by multiplying, in each clock cycle, a data sample and the error term to form an update term, and adding the update term to the coefficient. Preferably, the error term includes an adaptation gain. Preferably, the error term is the difference between a desired output and the FIR filter output calculated during the preceding frame. The desired output is preferably based on a system output value measured during the preceding frame.

Also in accordance with the present invention is a method for implementing a one-clock-cycle-per-tap delayed adaptive least-mean-square filter in a programmable DSP, in which the filter acquires a new data sample each frame. This method includes reading a coefficient from a coefficient buffer, reading from a data buffer a first data sample which corresponds to the coefficient, multiplying the coefficient by the first data sample and accumulating the product in a register to form an FIR filter output, updating the coefficient by adding to the coefficient the product of an error term, calculated during the preceding frame, and a second data sample, acquired during the frame preceding the frame in which the first data sample was acquired, and writing the immediately preceding coefficient to the coefficient buffer. Preferably, the error term includes an adaptation gain. Preferably, the error term is the difference between a desired output and the FIR filter output calculated during the preceding frame. The desired output is preferably based on a system output value measured during the preceding frame.

In another embodiment of this method, in addition to reading the first data sample from the data buffer, a second data sample, acquired during the frame preceding the frame in which the first data sample was acquired, is also read. The updated coefficient is then formed by adding to the coefficient the product of the second data sample and the error term.

Also in accordance with the present invention is a circuit architecture in a programmable DSP for implementing a delayed adaptive LMS filter in one clock cycle per tap, in which the filter acquires a new data sample each frame. The circuit includes two multiply and accumulate circuits (MACs) and an arithmetic logic unit (ALU). The first MAC multiplies a data sample and a corresponding coefficient to generate an FIR filter output. The second MAC multiplies the data sample and an error term, calculated during the preceding frame, to generate a current clock cycle update term. The ALU sums the previous cycle's update term and the coefficient in order to update the coefficient during the next clock cycle. Preferably, the circuit architecture also includes a data buffer to hold data samples and a coefficient buffer to hold the current values of filter coefficients. The coefficient buffer is preferably a random access memory (RAM) that can be accessed at least twice in one clock cycle. Such a RAM could be a dual-access RAM (DARAM), a dual-port RAM, or banked memory.

In another embodiment of this circuit architecture, the circuit includes only the two MACs and does not include an ALU. The first MAC operates as before, i.e. multiplying the first data sample and the corresponding coefficient to generate the FIR filter output. The second MAC multiplies a second data sample, acquired during the frame preceding the frame in which the first data sample was acquired, and the error term to generate the update term and then sums the update term and the coefficient in order to update the coefficient during the next clock cycle. This embodiment preferably includes both a coefficient buffer and a data buffer, and both of these buffers are preferably RAM that is able to be accessed at least twice in one clock cycle.

The present invention provides various advantages. One advantage is that the LMS filter uses the two MACs in a general purpose, programmable DSP architecture to perform the LMS procedure in a single clock cycle. As compared with conventional devices, which included only one MAC, the procedure is performed approximately twice as efficiently. Higher efficiency leads to lower power consumption. Another advantage is that one embodiment of the present invention does not require an ALU, leading to savings in hardware space and/or power over conventional devices which required an ALU. Moreover, implementing this filter in general purpose, programmable DSP modules saves money over implementations using application-specific integrated circuits.

Other technical advantages of the present invention will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

The present invention implements the LMS procedure in a general purpose, programmable DSP in one clock cycle per tap. The LMS procedure requires calculation of the FIR filter output and an updating of the filter coefficients using a one-frame delayed error term. In each clock cycle, the invention calculates one term of the FIR filter output and updates a coefficient. This updating includes adding an update term, which is a product of the error term and a data sample corresponding to the previous coefficient, to the coefficient. The updating temporarily stores the coefficient sum until the updated coefficient can be stored in the coefficient buffer during the next clock cycle. Meanwhile, the previous coefficient, which was updated during the previous clock cycle, is stored in the coefficient buffer in the current clock cycle. In each clock cycle, one implementation performs two memory reads, two multiplications, two additions, and a memory write. This implementation includes two MACs and an ALU along with two dual-port or dual-access RAMs or banked memory. An alternate implementation performs three memory reads, two multiplications, two additions, and a memory write. This alternate implementation requires only two MACs and the dual-port or dual-access RAMs or banked memory.

The clock cycle referred to is based on a system clock in which the DSP operates. For typical clock speeds of 200 MHz, a clock cycle is 5 ns. However, the actual speed of the clock is immaterial to the present invention. This method may operate nearly down to DC and is only limited by the speed of the system architecture.

Figure 1A:
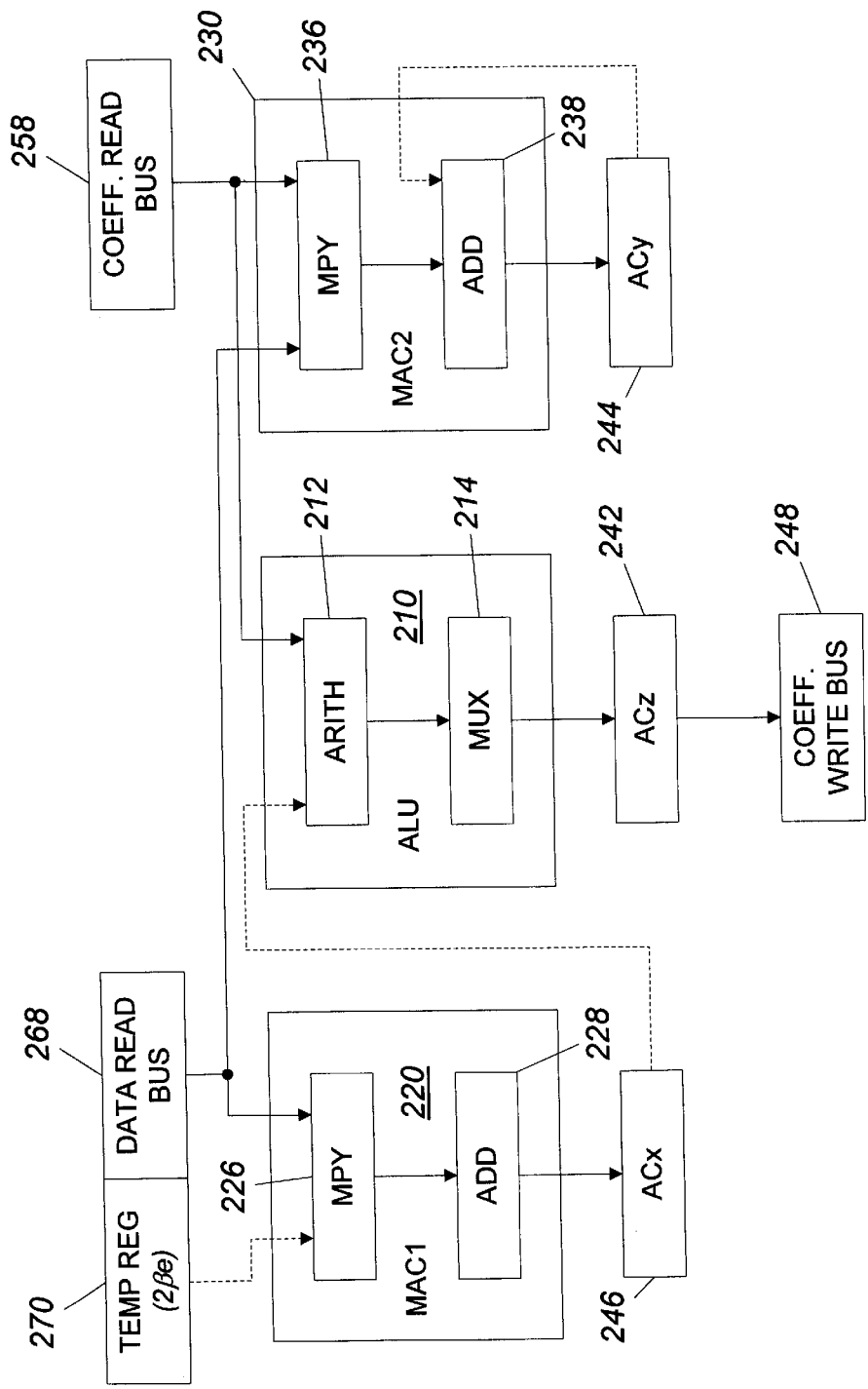
FIG. 1A is a block diagram of a delayed adaptive LMS filter in accordance with one embodiment of the present invention.

The first implementation of the present invention is shown in block diagram form in FIG. 1A. Included are ALU 210, first MAC 220 (MAC1), and second MAC 230 (MAC2). ALU 210 includes arithmetic unit 212 and multiplexor (MUX) 214. Each of the MACs includes a multiplier (MPY) 226, 236 and an adder (ADD) 228, 238. Three accumulators are also shown in FIG. 1A which hold values to be used later or to be stored. Accumulator Z (ACz) 242 holds the output of ALU 210 until it is written to memory. Accumulator Y (ACy) 244 holds the output of MAC2 230 which includes the running total of the FIR filter output. Accumulator X (ACx) 246 holds the output of MAC1 220 until it is used in ALU 210. Several buses are used with this implementation of the present invention. A coefficient read bus 258 contains the current clock cycle's coefficient and provides it to MPY 236 of MAC2 230 and arithmetic unit 212 of ALU 210. Data read bus 268 provides to MPY 226 of MAC1 220 and MPY 236 of MAC2 the data sample corresponding to the current clock cycle's coefficient. Write bus 248 stores in memory the coefficient corresponding to the previous clock cycle. Finally, temporary register 270 holds the delayed error term used to update the coefficients. This value is kept in a temporary register because it does not need to be updated every clock cycle.

Figure 1B:
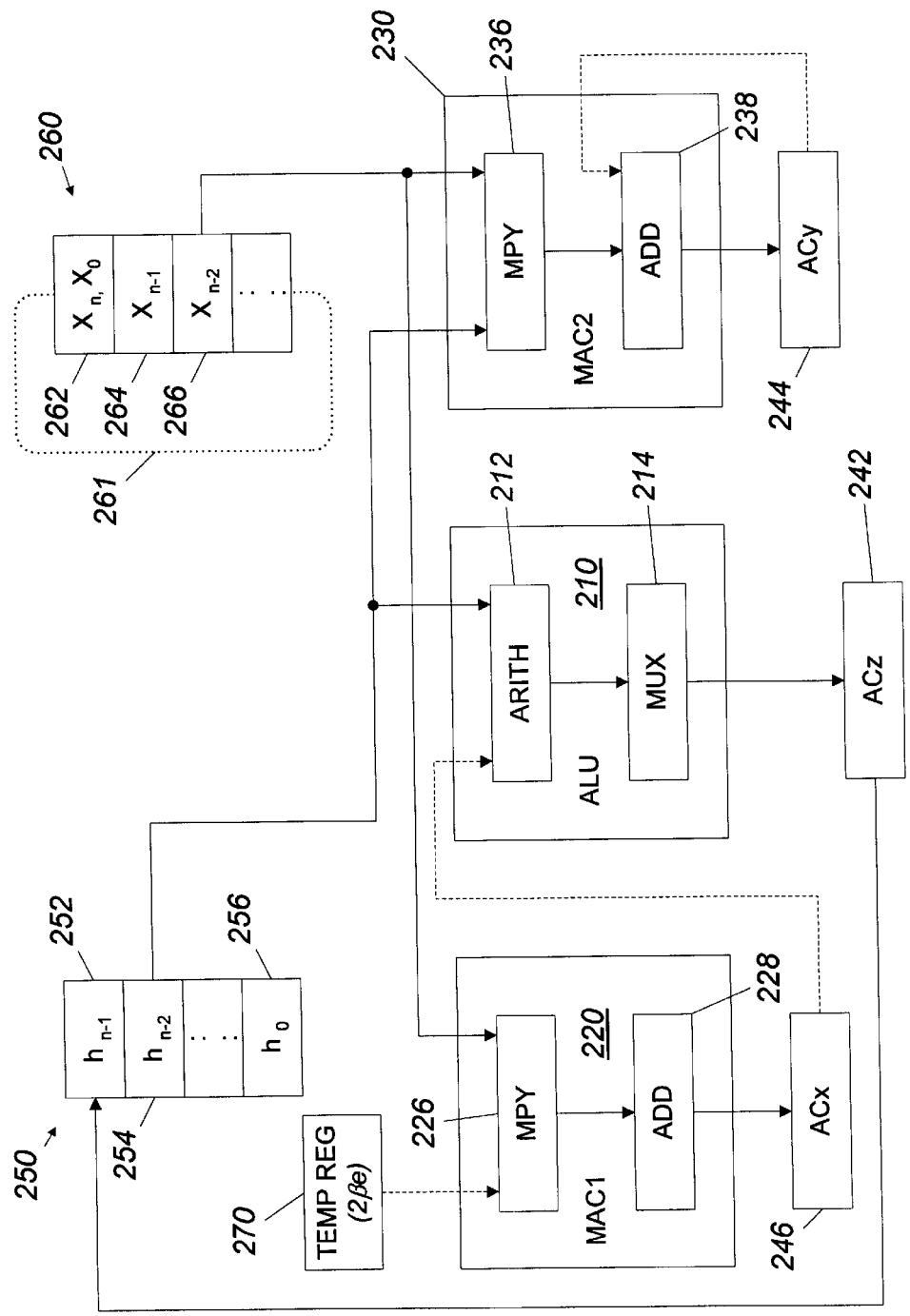
FIG. 1B is an expanded block diagram of FIG. 1A.

FIG. 1B is an expanded view of the implementation of FIG. 1A. Included in FIG. 1B are coefficient buffer 250 and data buffer 260. These buffers are preferably dual-port or dual-access RAM, but they could also be banked memory. Dual-port or dual-access RAM is RAM that can be accessed twice in a single clock cycle. Dual-port RAM usually includes two sets of address decoding logic and data latches, both of which can be accessed during the same clock cycle. Dual-access RAM, on the other hand, operates twice as fast as single-access RAM and operates both on the rising and falling edges of the system clock. This type of RAM may also be called "double data rate RAM" ("DDR RAM").

"Banked memory" comprises independent banks of memory such that sequential addresses access the separate banks. For example, the memory system could include four memory banks, with address 1 accessing bank 1, address 2 accessing bank 2, address 3 accessing bank 3, address 4 accessing bank 4, and address 5 accessing bank 1 again.

The key to all of these types of memory, which hereinafter will be referred to as "DARAM," is that they allow more than one memory access during a clock cycle.

Coefficient buffer 250 contains n coefficients, $h_0, h_1, \ldots, h_{n-2}, h_{n-2}$. Because this invention is directed to an adaptive filter, the coefficients are the n most recently updated coefficients. Shown as part of coefficient buffer 250 are exemplary buffer locations 252, 254, 256. The locations contain the values of coefficients $h_{n-1}$, $h_{n-2}$, and $h_0$, respectively. Data buffer 260 contains the n most recent data samples, and is a circular buffer, as indicated by dotted line 261. Shown as part of data buffer 260 are exemplary buffer locations 262, 264, 266. Location 262 contains the values of data samples $x_0$ and $x_n$, respectively the oldest and newest retained data samples. Buffer locations 264, 266 contain the values of data samples $x_{n-1}$ and $x_{n-2}$, respectively. After data sample $x_n$ is replaced by data sample $x_0$, data sample $x_{n-1}$ becomes the oldest retained data sample and $x_{n-2}$ the second oldest retained data sample.

The implementation of FIGS. 1A and 1B operates as follows. One loop is performed every time a new data sample is taken (i.e. every frame). A loop consists of two setup clock cycles and then n−1 LMS clock cycles (one clock cycle per tap). At the beginning of each loop, the accumulators are cleared and a delayed error term is stored in temporary register 270. This term is preferably the error calculated based on the FIR filter output from the previous data sample, i.e. during the previous frame. The error is thus delayed one frame. The term in temporary register 270 could be the calculated error e itself (i.e. the difference between the desired output and the FIR filter output during the previous frame). However, in practice, the error term used is a fraction of the calculated error e to optimize the convergence to achieving the minimum error. The fraction shown in FIGS. 1A and 1B, the adaptation gain, is $2*\beta$ (sometimes called $2\mu$), and the error term becomes $2\beta e$.

Once the accumulators are cleared and the temporary register is set up, the setup LMS cycles begin. During the first clock cycle (which is not shown in the FIGURES), data sample $x_n$, which was $x_{n-1}$ during the previous frame, is read from data buffer location 262 and placed on data read bus 268. During the same clock cycle, the value of the most recent data sample is copied to data buffer location 262, and this location then holds $x_0$.

Simultaneously with the copy of the most recent data sample to data buffer location 262, MAC1 220 generates the update term for $h_{n-1}$ by multiplying in MPY 226 $x_n$ and the error term in temporary register 270, which, as stated above, is preferably $2\beta e$. (The dashed arrow from temporary register 270 to MPY 226 indicates that the contents of temporary register 270 are "automatically" provided to MPY 226, possibly as a hard-wired connection between the register and MPY 226; This contrasts with the solid arrows which generally indicate connection via a bus.) The product, $x_n * 2\beta e$, is fed through adder 228 and temporarily stored in ACx 246.

During the second clock cycle, the first LMS iteration is performed, but the value written to memory is ignored while the architecture is being set up for repetitive cycling. Data sample $x_{n-1}$ is read from data buffer location 264 and placed on data read bus 268. Coefficient $h_{n-1}$ is simultaneously read from coefficient buffer location 252 and placed on coefficient read bus 258. MAC2 230 performs one calculation of the FIR filter output by multiplying $x_{n-1}$ and $h_{n-1}$ in MPY 236. The product is added in adder 238 to the contents of ACy 244, which is null because ACy 244 was just cleared out. This operation is "automatic" as indicated by the dashed arrow. The result of the sum (i.e. $0+x_{n-1}*h_{n-1}$) is placed in ACy 244.

Simultaneously with MAC2's operation, the contents of ACz 242 (which is null because ACz 242 was previously cleared) are placed on write bus 248 and written back to coefficient buffer 250, and placed in buffer location 252 ($h_{n-1}$). Thus, coefficient $h_{n-1}$ is overwritten with a dummy value temporarily. No needed information is lost, however, because the prior contents of data buffer location 252 were already placed on coefficient read bus 258.

Also simultaneously with MAC2's operation, ALU 210 updates coefficient $h_{n-1}$ with the contents of ACx 246 from the previous clock cycle (i.e. $x_n * 2\beta e$). This updating in arithmetic unit 212 adds $h_{n-1}$ to $x_n * 2\beta e$, and the sum is passed through MUX 214 to ACz 242, where it is kept until the next clock cycle.

Also simultaneously with the operation of MAC2 and the ALU, MAC1 220 generates the update term for the next coefficient $h_{n-2}$ by multiplying in MPY 226 $x_{n-1}$ and the error term in temporary register 270, which, as stated above, is preferably $2\beta e$. The product, $x_{n-1}*2\beta e$, is fed through adder 228 and temporarily stored in ACx 246.

During the third clock cycle (shown in FIG. 1B), data sample $x_{n-2}$ is read from data buffer location 266 and placed on data read bus 268. Coefficient $h_{n-2}$ is simultaneously read from coefficient buffer location 254 and placed on coefficient read bus 258. MAC2 230 performs one calculation of the FIR filter output by multiplying $x_{n-2}$ and $h_{n-2}$ in MPY 236, the results of which are added in ADD 238 to the contents of ACy 244 which contains the running FIR filter output. The result of the sum (i.e. $x_{n-1}*h_{n-1}+x_{n-2}*h_{n-2}$) is placed in ACy 244.

Simultaneously with the operation of MAC2, the contents of ACz 242 ($h_{n-1}+x_n*2\beta e$) are placed on write bus 248 and written back to coefficient buffer 250, and placed in buffer location 252 ($h_{n-1}$) Thus, coefficient $h_{n-1}$ is updated using coefficient $h_{n-1}$ and data sample $x_n$. Although the theoretical LMS procedure would update $h_{n-1}$ using $h_{n-1}$ and $x_{n-1}$, this delayed LMS filter uses the previous data sample and the error from the previous frame, rather than from the present frame. If this filter were not delayed, the procedure would have to wait for the error for the current frame to be calculated, which would result in repeated FIR output calculations (and twice as many clock cycles).

Once ACz 242 is emptied of the previous updated coefficient, it is ready to store the next updated coefficient. Thus, the contents of ACx 246 from the previous clock cycle (i.e. $x_{n-1}*2\beta e$) are added in arithmetic unit 212 to $h_{n-2}$ to form $x_{n-1}*2\beta e+h_{n-2}$. This sum is passed through MUX 214 to ACz 242, where it is kept until the next clock cycle.

Finally, MAC1 220 generates the next update term by multiplying $x_{n-2}$ and $2\beta e$. The product is fed through adder 228 and temporarily stored in ACx 246.

The process described in the third clock cycle repeats in subsequent clock cycles, decrementing by one the coefficient and data locations in each subsequent cycle. MAC2 230 performs and stores $$\sum_{k=0}^{n-1} x_k h_k$$

in ACy 244. The contents of ACz 242 are written back to a previous coefficient's memory location. The update term stored in ACx 246 is added in ALU 210 to the current coefficient, and the sum is stored in ACz 242. Then, MAC1 220 calculates and stores the next update term. To update each coefficient, the implementation of FIGS. 1A and 1B thus performs two reads (a data read and a coefficient read), two multiplications (for the FIR filter output and the update term), two additions (accumulation of the FIR filter output and the updating of the coefficient), and one write (the updated coefficient). Because the architecture includes two MACs (which include two multipliers), this implementation can perform the calculations for each tap in a single clock cycle. The prior architecture had only one MAC and one ALU, and therefore could not perform both multiplications in a single clock cycle. This implementation is therefore approximately twice as efficient as that prior architecture.

Figure 2A:
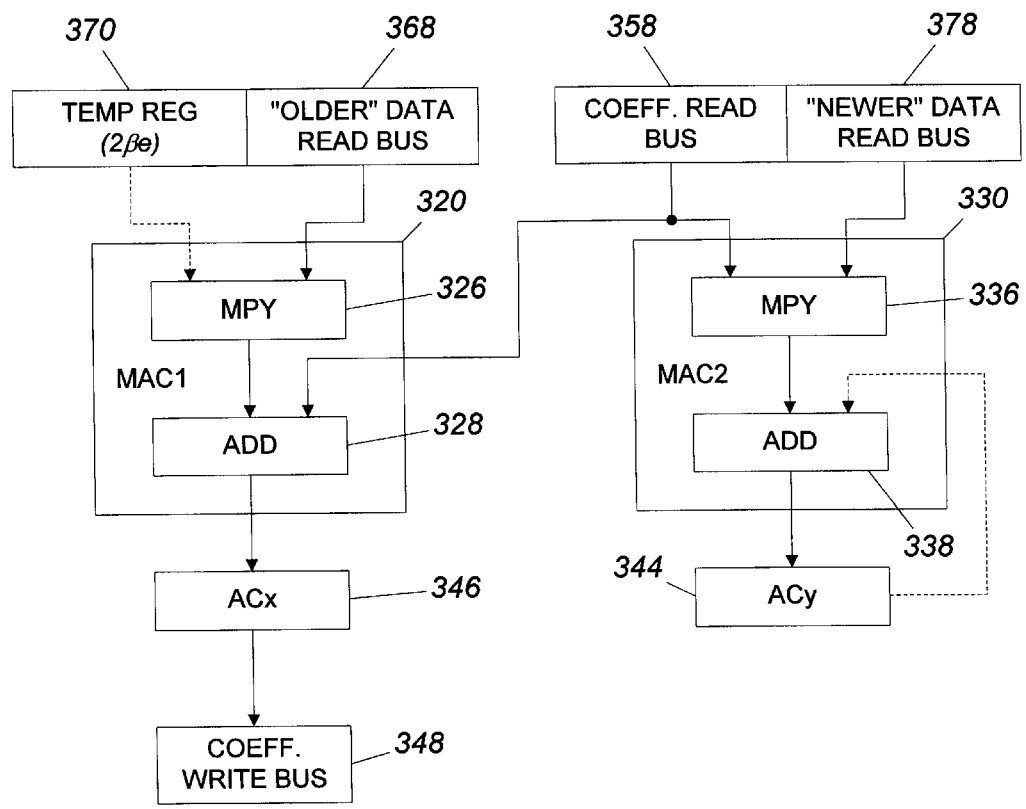
FIG. 2A is a block diagram of a delayed adaptive LMS filter in accordance with another embodiment of the present invention.
Figure 2B:
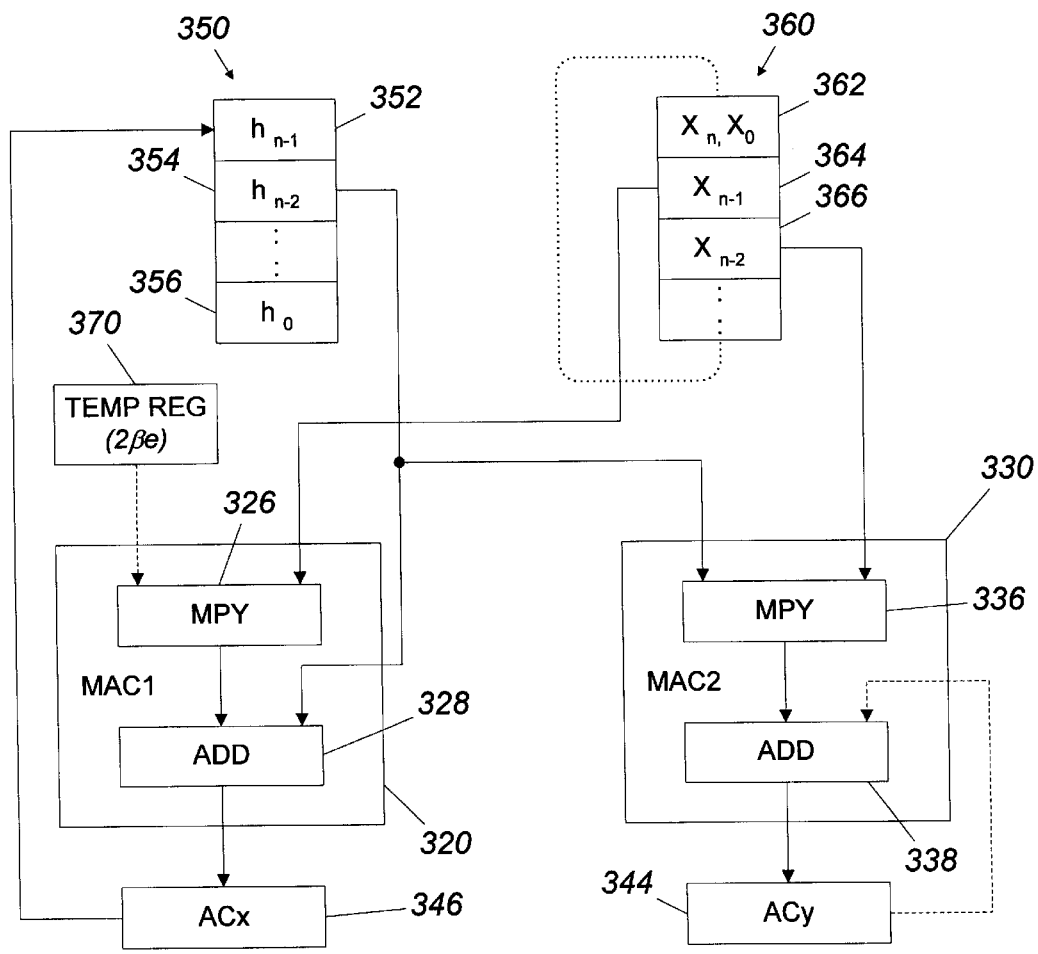
FIG. 2B is an expanded block diagram of FIG. 2A.

Further efficiencies can be achieved by using the alternate implementation shown in FIGS. 2A and 2B. This implementation uses only two MACs and does not use or require an ALU. The descriptions of MAC1 320 and MAC2 330 are analogous to those of MAC1 220 and MAC2 230, along with their components, MPY 326 and ADD 328 in MAC1 320, and MPY 336 and ADD 338 in MAC2 330. Likewise, temporary register 370 is analogous to temporary register 270, and coefficient read bus 358 and write bus 348 are analogous to coefficient read bus 258 and write bus 248, respectively. As in the first implementation, this implementation uses a data read bus 368; however, there is an additional data read bus 378. Data read bus 368 carries "older" data and data read bus 378 carries "newer" data, as will be explained below. In this implementation, the output of accumulator ACx 346 is placed on write bus 348, rather than being internally routed to the ALU as in the previous implementation.

FIG. 2B is an expanded view of the implementation of FIG. 2A. Included in FIG. 2B are coefficient buffer 350 and data buffer 360, which is a circular buffer, and they are analogous to coefficient buffer 250 and data buffer 260, respectively. These buffers are also preferably DARAMs. Coefficient buffer 350 contains the n most recently updated coefficients, $h_0, h_1, \ldots, h_{n-2}, h_{n-1}$. Coefficient buffer 350 includes exemplary buffer locations 352, 354, 356 which contain the values of coefficients $h_{n-1}, h_{n-2}$, and $h_0$, respectively. Data buffer 360 contains the n most recent data samples. Location 362 may contain the values of data samples $x_0$ or $x_n$, respectively the oldest and newest retained data samples. Buffer locations 364, 366 contain the values of data samples $x_{n-1}$ and $x_{n-2}$, respectively, and are exemplary of the remaining n−3 memory locations. After data sample $x_n$ is replaced by data sample $x_0$, data sample $x_{n-1}$ becomes the oldest retained data sample and $x_{n-2}$ the second oldest retained data sample.

The implementation of FIGS. 2A and 2B operates as follows. As before, the loop requires two setup clock cycles and then n−1 LMS clock cycles. At the beginning of the loop, the accumulators are cleared and the preferred error term $2\beta e$ is stored in temporary register 370. During the first clock cycle (which is not shown in the FIGURES), the first LMS iteration is performed, but the value written to memory is false while the architecture is being set up for repetitive cycling. Data sample $x_{n-1}$ is read from data buffer location 364 and placed on the "newer" data read bus 378. Coefficient $h_{n-1}$ is simultaneously read from coefficient buffer location 352 and placed on coefficient read bus 358. Data sample $x_n$ is read from data buffer location 362 and is placed on "older" data read bus 368. Thus, "newer" indicates the data sample corresponding to the current coefficient, and "older" indicates the previous data sample.

The operation of MAC2 330 is analogous to that of MAC2 230. MAC2 330 performs one calculation of the FIR filter output by multiplying $x_{n-1}$ and $h_{n-1}$ in MPY 336. The product is added in adder 338 to the contents of ACy 344, which is null because ACy 344 was just cleared. The result of the sum (i.e. $0+x_{n-1}*h_{n-1}$) is placed in ACy 344.

Also in this first clock cycle, the value of ACx 346 is stored to coefficient buffer 350 in location 352 ($h_{n-1}$) via write bus 348. The value being stored during this cycle is a dummy value. However, no information is lost because the previous value of coefficient $h_{n-1}$ was already placed on coefficient read bus 358. In MAC1 320, MPY 326 multiplies the older data sample $x_n$ and the error term (i.e. $x_n*2\beta e$). This result is added to coefficient $h_{n-1}$ in adder 328 within MAC1 320. The resulting updated coefficient, $h_{n-1}+x_n*2\beta e$, is placed into accumulator ACx 346.

During the second clock cycle, the latest input data sample is copied into data buffer 360 at location 362. This location now becomes $x_0$.

During the third clock cycle (shown in FIG. 2B), data sample $x_{n-2}$ is read from data buffer location 366 and placed on "newer" data read bus 378. Data sample $x_{n-1}$ is read from data buffer location 364 and is placed on "older" data read bus 368. Coefficient $h_{n-2}$ is simultaneously read from coefficient buffer location 354 and placed on coefficient read bus 358. MAC2 330 performs one calculation of the FIR filter output by multiplying $x_{n-2}$ and $h_{n-2}$ in MPY 336. The product is added in adder 338 to the contents of ACy 344, which contains the running FIR filter output. The result of the sum (i.e. $x_{n-1}*h_{n-1}+x_{n-2}*h_{n-2}$) is placed in ACy 344.

During this cycle, the contents of ACx 346, $h_{n-1}+x_n 2\beta e$, are placed on write bus 348 and written to coefficient buffer 350 and placed in buffer location 352, which previously contained $h_{n-1}$. In this implementation, coefficient $h_{n-1}$ is updated using coefficient $h_{n-1}$ and data sample $x_n$, a result which is proper because this filter is also a "delayed" LMS filter. Next, MAC1 320 generates the next coefficient update term by multiplying in MPY 326 $x_{n-1}$ and $2\beta e$. The product, $x_{n-1}*2\beta e$, is added in adder 328 to $h_{n-2}$ and temporarily stored in ACx 346 awaiting writing back to buffer 350 during the next clock cycle.

This process repeats in subsequent cycles, decrementing by one the coefficient and data locations in each subsequent cycle. MAC2 330 performs and stores $$\sum_{k=0}^{n-1} x_k h_k$$

in ACy 344. The contents of ACx 346 are written back to a previous coefficient's memory location. MAC1 320 calculates the next update term and adds it to the current coefficient, and the sum is stored in ACx 346.

As compared to the implementation of FIGS. 1A and 1B, to update each coefficient, the alternate implementation of FIGS. 2A and 2B thus performs three reads (an "older" data read, a "newer" data read, and a coefficient read), two multiplications (for the FIR filter output and the update term), two additions (accumulation of the FIR filter output and the updating of the coefficient), and one write (the updated coefficient). Like the implementation of FIGS. 1A and 1B, this implementation can perform the calculations for each tap in a single clock cycle. However, because there is no ALU, the implementation uses less space and power on the DSP or circuit board.

Both of these implementations are approximately twice as efficient as those used in prior devices, and use concomitantly less power. Because they are implemented using general purpose, programmable DSPs, they can be less expensive than filters implemented using application-specific integrated circuits.

Although the present invention has been described in detail by reference to specific embodiments thereof, it should be understood that various changes, substitutions, and alterations can be made to such embodiments without departing from the spirit and scope of the invention as defined by the appended claims.

What is claimed is:

1. A method for implementing a one-clock-cycle-per-tap delayed adaptive least-mean-square filter in a programmable digital signal processor operating in clock cycles, the programmable digital signal processor including first and second multiply-accumulator units, the filter acquiring a new data sample each frame of a time sequence of frames, the method comprising for each clock cycle:

reading a coefficient from a coefficient buffer;

reading from a data buffer a first data sample corresponding to the coefficient;

reading from the data buffer a second data sample acquired during the frame immediately preceding the frame in which the first data sample was acquired;

reading an error term calculated during a previous frame from a buffer;

multiplying the coefficient and the first data sample and accumulating the product in the first multiply-accumulate unit to form an output of a finite impulse response (FIR) filter;

updating the coefficient by multiplying the second data sample and the error term, then adding to the coefficient the product of the second data sample and the error term, in the second multiply-accumulator; and writing the immediately preceding coefficient to the coefficient buffer.

2. The method according to claim 1, wherein the error term comprises an adaptation gain.

3. The method according to claim 1, wherein the error term comprises the difference between a desired output and the FIR filter output calculated during the frame immediately preceding the current frame.

4. The method according to claim 1, wherein the desired output is based on a system output value measured during the frame immediately preceding the current frame.

5. A circuit architecture in a programmable digital signal processor for implementing a delayed adaptive least-mean-square filter in one clock cycle per tap, the filter acquiring a new data sample each frame of a time sequence of frames, the circuit architecture comprising:

an error term buffer storing an error term calculated during a frame immediately preceding the current frame;

a data buffer to hold data samples;

a coefficient buffer to hold the current values of filter coefficients;

wherein the coefficient buffer and the data buffer each comprise a random access memory accessible at least twice in on clock cycle;

first and second multiply and accumulate circuits, wherein:

the first multiply and accumulate circuit multiplies a first data sample recalled from said data buffer and a corresponding coefficient recalled from said coefficient buffer to generate an output of a finite impulse response (FIR) filter; and the second multiply and accumulate circuit multiplies a second data sample, acquired during the frame immediately preceding the frame in which the first data sample was acquired recalled from said data buffer, and an error term, calculated during the frame immediately preceding the current frame recalled from said error term buffer, to generate an update term, and sums the update term and the coefficient for updating the coefficient during the clock cycle immediately following the current clock cycle.

6. The circuit architecture according to claim 5, wherein the random access memory is dual access RAM.

7. The circuit architecture according to claim 5, wherein the random access memory is dual port RAM.

8. The circuit architecture according to claim 5, wherein the random access memory is banked memory.

* * * * *